United States Patent [19]

Rinaldi

[11] Patent Number: 4,467,285

[45] Date of Patent: * Aug. 21, 1984

[54] PULSE MONITOR CIRCUIT

[75] Inventor: Gerald M. Rinaldi, Mundelein, Ill.

[73] Assignee: GTE Automatic Electric Labs Inc., Northlake, Ill.

[*] Notice: The portion of the term of this patent subsequent to Aug. 16, 2000 has been disclaimed.

[21] Appl. No.: 333,238

[22] Filed: Dec. 21, 1981

[51] Int. Cl.³ .............................................. H03K 5/26
[52] U.S. Cl. .................................. 328/112; 307/234; 307/518; 328/120
[58] Field of Search ....................... 328/111, 112, 120; 307/234, 518

[56] References Cited

U.S. PATENT DOCUMENTS

| | | | |
|---|---|---|---|
| 3,946,322 | 3/1976 | Katz | 328/111 |
| 3,961,203 | 6/1976 | Hutch | 307/518 |
| 4,342,112 | 7/1982 | Stodola | 328/120 |
| 4,353,091 | 10/1982 | Hoppe | 328/120 |
| 4,374,361 | 2/1983 | Holden | 328/120 |
| 4,399,412 | 8/1983 | Rinaldi | 328/112 |

Primary Examiner—Stanley D. Miller
Assistant Examiner—Timothy P. Callahan
Attorney, Agent, or Firm—Gregory G. Hendricks; Robert J. Black

[57] ABSTRACT

A pulse monitor circuit which detects pulse failures through use of a detection circuit and a storage circuit. The detection circuit detects failure of the monitored pulses after being periodically reset by an external reference pulse train. The storage circuit is clocked by the reference pulses and operates to store the output signals of the detection circuit. Upon detection of a pulse failure to monitor can be cleared by external control or detection of a monitored pulse.

17 Claims, 3 Drawing Figures

PULSE MONITOR CIRCUIT

BACKGROUND OF THE INVENTION (1) Field of the Invention

The present invention relates to digital switching systems and more particularly to a pulse monitor circuit for use in such switching systems.

(2) Description of the Prior Art

Typical digital pulse monitor circuits require complex logic circuitry and are often unreliable and subject to race conditions. A recent advancement in the state of the art was disclosed by H. Ballentine in an article entitled "Clock-Activity Detector Uses One DIP", Electronic Design News, Jan. 5, 1980, page 156. However, this circuit is still relatively complex, and any detected failure signal is cleared when the monitored clock signal reappears. Some implementations of this circuit may also suffer from insufficient clear pulse widths.

Accordingly, it is the object of the present invention to provide a minimum component, highly reliable pulse monitor circuit, free of any potential race problems and resettable by an external clear signal or reappearance of the monitored pulse.

SUMMARY OF THE INVENTION

The present invention is a circuit which detects the occurrence of monitored pulses during time intervals defined by an external reference signal. This external reference signal clocks a storage circuit, while a detection circuit is clocked in response to monitored pulses. The detection circuit is also reset by the external reference signal.

The frequency of the reference clock pulses is less than half the frequency of the monitored clock pulses. This ratio guarantees that at least one monitored clock pulse edge occurs for each reference pulse.

If a monitored clock pulse edge occurs during the reference pulse the detection circuit switches to a set state. Its output signals are then transferred into the storage circuit when that circuit is clocked by the trailing edge of the reference pulse. This storage circuit then provides a clock detected signal.

If the monitored pulse does not appear during the reference pulse, the detection circuit does not switch out of the reset state. Its output signals are then transferred to the storage circuit when that circuit is clocked by the trailing edge of the reference pulse. The storage circuit then provides a clock failure signal.

In one mode of operation, the clock failure condition is latched and the storage circuit thus provides a failure indication even if the monitored clock pulse signal reappears. Therefore, a failure condition can only be reset by an external clear signal. In an alternate mode of operation the clock failure condition is not latched. Therefore an external clear signal is not required since the failure condition will be cleared when the monitored pulse reappears.

DESCRIPTION OF THE PREFERRED EMBODIMENT

Figure 1:
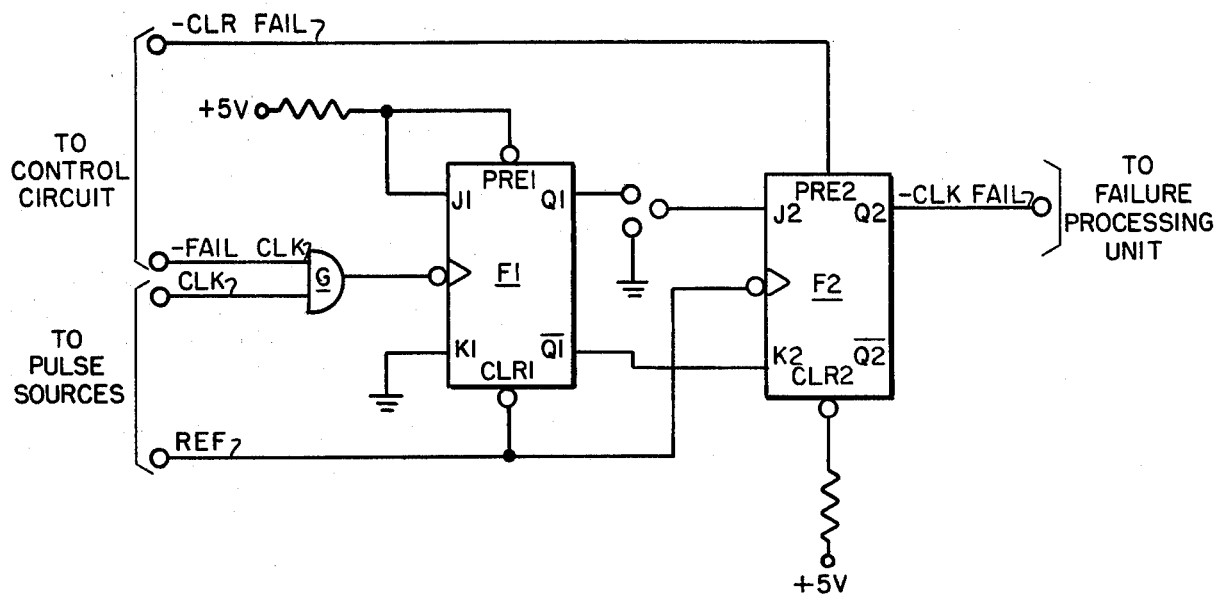
FIG. 1 is a logic diagram of a first embodiment of a pulse monitor circuit in accordance with the present invention.

Referring now to FIG. 1, a first embodiment of the pulse monitor circuit of the present invention is shown. The $\overline{Q1}$ output of flip-flop F1 is shown connected to the K2 input of flip-flop F2. Input J2 is shown connectable to either the Q1 output of flip-flop F1 or to ground. The inputs, J1 and K1, of flip-flop F1 are shown connected to 5V and ground respectively. The clear input of flip-flop F1 and a negative edge triggered clock input of flip-flop F2 are shown connected to an external reference (REF) pulse source. The negative edge triggered clock input of flip-flop Ff1 is shown connected to the monitored clock pulse (CLK) source via AND gate G. This gate is also shown connected to an external clock failure (−FAIL CLK) routining control circuit. The preset input of flip-flop F2 is shown connected to an external clear signal (−CLR FAIL) control circuit while the Q2 output of flip-flop F2 provides a clock failure (−CLK FAIL) signal. Flip-flops F1 and F2 have a zero hold time requirement for data appearing at the J and K inputs with respect to a negative clock edge.

The frequency of the REF pulse signal is chosen to be less than half the frequency of the monitored CLK signal. This ratio guarantees that, during normal operation, at least one negative going CLK pulse edge occurs during the high time of the REF signal.

To initialize this circuit a logic level 0 clear signal (−CLR FAIL) is applied to the preset input of storage flip-flop F2. This causes flip-flop F2 to clear the failure detected signal (−CLK FAIL) by applying a logic level 1 signal to its Q2 output.

During normal operations, the routining control signal (−FAIL CLK) is at a logic level 1. Therefore, the monitored CLK pulse is normally applied by gate G to the clock input of flip-flop F1. When a negative going edge of a monitored CLK pulse appears at the clock input of flip-flop F1 while REF is high the logic level 1 and 0 signals, at the J1 and K1 inputs, are transferred to the Q1 and $\overline{Q1}$ outputs, respectively, of flip-flop F1. When the negative going edge of a REF pulse subsequently appears at the clear input of flip-flop F1 it causes this flip-flop to reset. However, since the REF pulse simultaneously appears at the clock input of flip-flop F2, this flip-flop responds to the signals appearing at its inputs before flip-flop F1 is reset.

If the J2 input is connected to the Q1 output the logic level 1 and 0 signals at the Q1 and $\overline{Q1}$ outputs appear at the J2 and K2 inputs respectively. When the negative going edge of a REF pulse subsequently appears at the clock input of flip-flop F2, these logic level 1 and 0 signals are clocked into flip-flop F2 and a logic level 1 signal again appears at the Q2 output.

If the J2 input is connected to ground, logic level 0 signals appear at both the J2 and K2 inputs. With this arrangement, when the negative going edge of a REF pulse appears at the clock input of flip-flop F2, the logic level 1 signal at the Q2 output again remains unchanged, since flip-flop F2 does not switch when logic level 0 signals appear at its J2 and K2 inputs. Thus the absence of a failure condition is maintained since the −CLK FAIL signal remains at a logic level 1 as long as a negative going monitored CLK pulse edge occurs during the high time of the REF signal.

If the CLK pulse fails, flip-flop F1, after being reset by the REF pulse, remains reset with logic level 0 and 1 signals on its Q1 and $\overline{Q1}$ outputs respectively.

If the J2 input is connected to the Q1 output these logic level 0 and 1 signals appear at the J2 and K2 inputs respectively. When the negative going edge jof a REF pulse subsequently appears at the clock input of flip-flop F2, it switches state and a logic level 0 signal appears at its Q2 output. Thus the failure condition is detected since the $-$CLK FAIL signal is at a logic level 0. In this configuration, the failure condition can be cleared upon reappearance of a CLK pulse. If a CLK pulse does reappear logic level 1 and 0 signals appear at the Q1 and $\overline{Q1}$ outputs respectively. Therefore, these signals also appear at the J2 and K2 inputs. Consequently, flip-flop F2 switches out of the failure state and the $-$CLK FAIL signal returns to a logic level 1.

If the J2 input is connected to ground, logic level 0 and 1 signals still appear at the Q1 and $\overline{Q1}$ outputs when a CLK pulse fails. However, only the K2 input responds to a signal from flip-flop F1 since a logic level 0 signal (ground) constantly appears at the J2 input. With this arrangement, when the negative going edge of a REF pulse appears at the clock input of flip-flop F2, it switches state and a logic level 0 signal appears at its Q2 output. Thus the failure condition is again detected since the $-$CLK FAIL signal is again at a logic level 0. However, in this configuration, the failure condition can only be cleared by a logic level 0 external clear signal $-$CLR FAIL applied to the preset input of flip-flop F2. Reappearance of a CLK pulse will not clear the failure condition. It will cause flip-flop F1 to set, but this only results in logic level 0 signals being applied to the J2 and K2 inputs since J2 is connected to ground and a logic level 0 signal appears at K2 via $\overline{Q1}$. Flip-flop F2 will not switch under such conditions and therefore the failure condition is not cleared.

Gate G provides a means for routining the pulse monitor circuit since it allows for the simulation of a monitored CLK pulse failure condition. This routining occurs when a logic level 0 ($-$FAIL CLK) signal appears at the first input of gate G. Since this gate is an AND gate, it responds to the logic level 0 ($-$FAIL CLK) signal by applying a logic level 0 signal to the clock input of flip-flop F1. The resultant absence of clock pulses at this input appears as a normal CLK pulse failure and it should cause the pulse monitor to generate a logic level 0 ($-$CLK FAIL) signal if it is operating properly.

Figure 2:
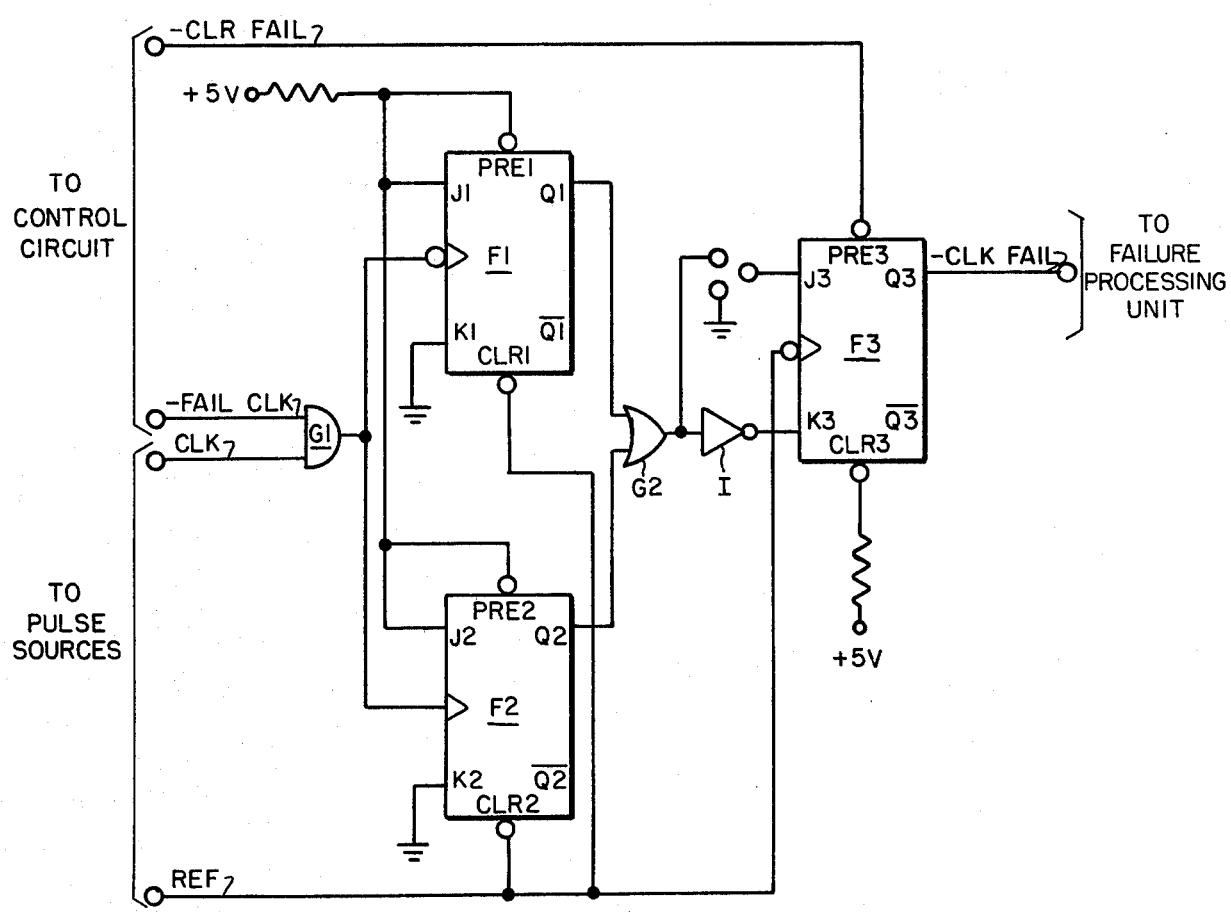
FIG. 2 is a logic diagram of a second embodiment of a pulse monitor circuit in accordance with the present invention.

Referring now to FIG. 2, a second embodiment of the present invention is shown. This circuit includes two detection flip-flops F1 and F2 rather than the single detection flip-flop Ff1 shown in FIG. 1. This arrangement allows quicker detection of a CLK pulse edge failure. Since flip-flop F1 is clocked by a negative going CLK pulse edge and flip-flop F2 is clocked by a positive going CLK pulse edge, the frequency of the REF signal need only be less than the frequency of the CLK signal to insure that at least one CLK pulse edge, positive or negative, is detected during each high time of the REF pulse. Thus the REF frequency is approximately twice the frequency of the REF signal used in the pulse monitor of FIG. 1 and therefore, CLK pulse edge failures are detected twice as fast with the pulse monitor of FIG. 2.

OR gate G2 and inverter I provide means for applying the output signals of these two detection flip-flops, F1 and F2, to the inputs of storage flip-flop F3.

In all other respects, the operation of this pulse monitor is the same as that described for the pulse monitor of FIG. 1.

Figure 3:
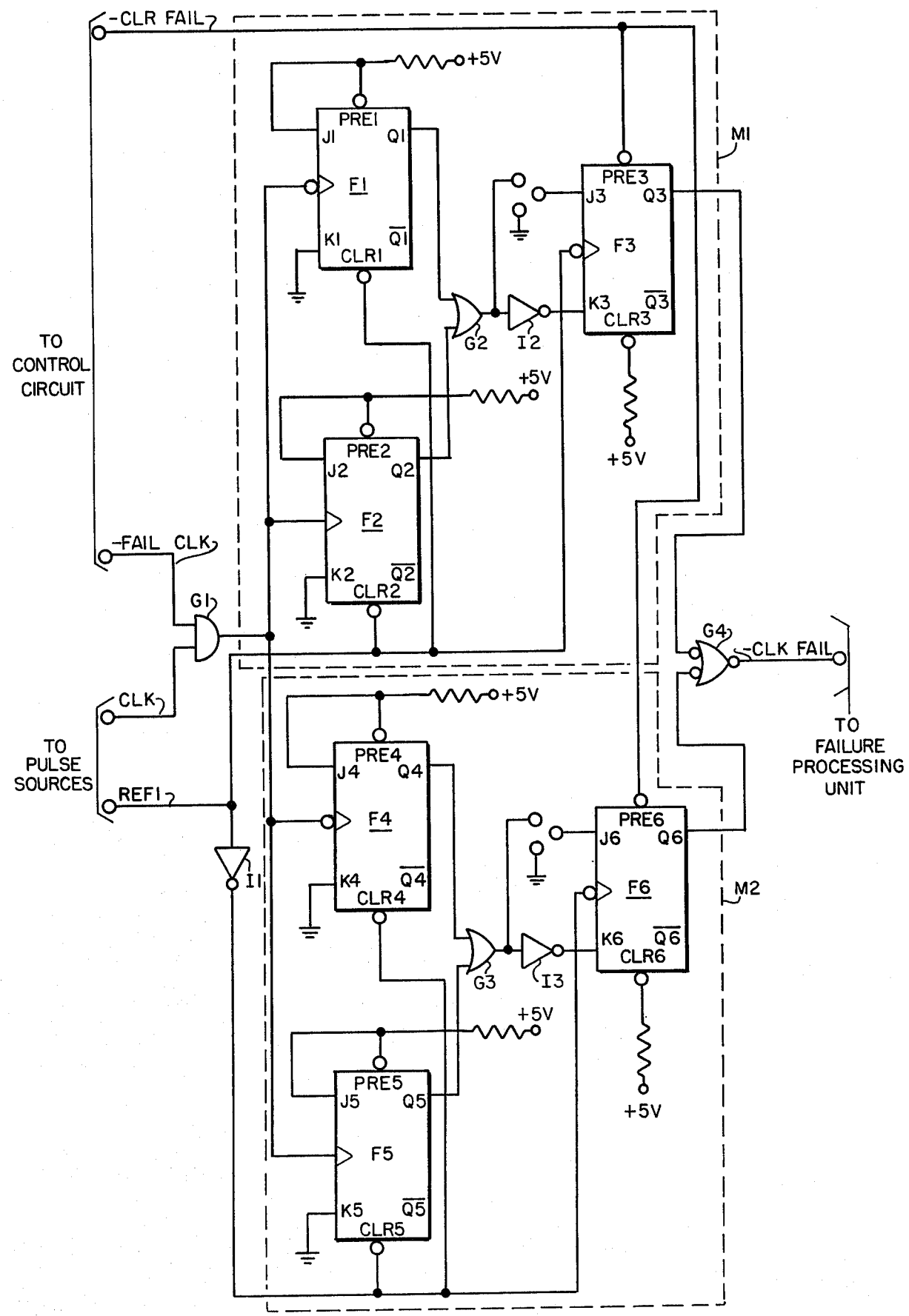
FIG. 3 is a logic diagram of a third embodiment of a pulse monitor circuit in accordance with the present invention.

Referring now to FIG. 3, a third embodiment of the present invention is shown. This circuit includes two pulse monitor circuits, M1 and M2. These pulse monitors are the same as those shown in FIG. 2. This arrangement allows even quicker detection of a CLK pulse failure since flip-flops F1-F3 detect a CLK pulse edges (positive or negative) during the high time of the REF signal and flip-flops F4-F6 detect a CLK pulse edges (positive or negative) during the low time of the REF signal. Therefore, this circuit detects CLK pulse edge failures approximately twice as fast as the pulse monitor of FIG. 2. Inverter I1 inverts the REF pulse input of M2 and "AND" gate G4 combines the failure signals from both circuits into a common $-$CLK FAIL signal. Otherwise, the operation of monitors M1 and M2 are the same as that described for the pulse monitor of FIG. 2.

The present invention thus discloses three embodiments of a highly reliable pulse monitor circuit which are not susceptible to race conditions and can be reset by either an external clear signal or reappearance of monitored CLK pulse.

It will be obvious to those skilled in the art that numerous modifications of the present invention have been made without departing from the spirit of the invention which shall be limited only by the scope of the claims appended hereto.

What is claimed is:

1. A pulse monitor circuit for use in a switching system, inluding a source of reference signal pulses having first and second polarities and a clock signal source normally operated to provide clock signal pulses with first and second edges, and abnormally operated to produce a clock signal pulse without said first or second edges, said pulse monitor circuit comprising:

first detection means connected to said clock signal source and said reference signal source, operated in response to a reference signal pulse of said first polarity and an absence of said first edge of a clock signal pulse to provide a first failure detected signal;

said first detection means further operated in response to a reference signal pulse of said second polarity to clear said first failure detected signal; and first storage means connected to said first detection means and to said reference signal source, operated in response to said reference signal pulse of second polarity and said first failure detected signal to provide a first clock failure signal.

2. A pulse monitor circuit as claimed in claim 1, wherein: said first detection means is further operated in response to a reference signal pulse of said first polarity and an absence of said second edge of a clock signal pulse to provide said first failure detected signal.

3. A pulse monitor circuit as claimed in claim 1, wherein: said first storage means is further operated in response to said reference signal pulse of second polarity and an absence of said first failure detected signal to clear said first clock failure signal.

4. A pulse monitor circuit as claimed in claim 1, wherein there is further included:

second detection means connected to said clock signal source and said reference signal source operated in response to a reference signal pulse of said second polarity and an absence of said first edge of a clock signal pulse to provide a second failure detected signal;

said second detection means further operated in response to a reference signal pulse of first polarity to clear said second failure detected signal; and second storage means connected to said second detection means and to said reference signal source, operated in response to said reference signal pulse of first polarity and said second failure detected signal to provide a second clock failure signal.

5. A pulse monitor circuit as claimed in claim 4, wherein: said second detection means is further operated in response to a reference signal pulse of second polarity and an absence of said second edge of clock signal pulse to provide said second failure detected signal.

6. A pulse monitor circuit as claimed in claim 4, wherein: said second storage means is further operated in response to said reference signal pulse of first polarity and an absence of said second failure detected signal to clear said second clock failure signal.

7. A pulse monitor circuit as claimed in claim 4, wherein there is further included: gating means connected to said first and second storage means operated in response to said first or second clock failure signal to provide a gated clock failure signal.

8. A pulse monitor circuit as claimed in claim 4, wherein there is further included: a clear signal source; said first and second storage means each further connected to said clear signal source, and each further operated in response to said clear signal to clear said first and second clock failure signals respectively.

9. A pulse monitor circuit as claimed in claim 4, wherein there is further included, a routining signal source, said pulse monitor circuit further comprising: routining means connected to said clock signal source and said routining signal source, operated in response to said routining signal to inhibit said clock signal from appearing at said first and second detection means.

10. A pulse monitor circuit as claimed in claim 1, wherein said first detection means comprises: a flip-flop having a positive edge triggered clock input connected to said clock signal source and a clear input connected to said reference signal source.

11. A pulse monitor circuit as claimed in claim 2, wherein said first detection means comprises: a first flip-flop having a positive edge triggered clock input connected to said clock signal source and a clear input connected to said reference signal source;

a second flip-flop having a negative edge triggered clock input connected to said clock signal source and a clear input connected to said reference signal source; and gating means connected to said first and second flip-flop.

12. A pulse monitor circuit as claimed in claim 4, wherein said second detection means comprises: a flip-flop having a positive edge triggered clock input connected to said clock signal source; an inverter; and a clear input connected to said reference signal source via said inverter.

13. A pulse monitor circuit as claimed in claim 5, wherein said second detection means comprises: a first flip-flop having a positive edge triggered clock input connected to said clock signal source; an inverter; and a clear input connected to said reference signal source via said flip-flop having a negative edge triggered clock input connected to said clock signal source; and a clear input connected to said reference signal source via said inverter; and gating means connected to said first and second flip-flops.

14. A pulse monitor circuit as claimed in claim 1, wherein said first storage means comprises: a flip-flop having a clock input connected to said reference signal source, a first data input connected to ground, and a second data input connected to said first detection means.

15. A pulse monitor circuit as claimed in claim 3, whereifn said first storage means comprises: a flip-flop having a clock input connected to said reference signal source and first and second data inputs connected to said first detection means.

16. A pulse monitor circuit as claimed in claim 4, wherein said second storage means comprises: an inverter; a flip-flop having a clock input connected to said reference signal source via said inverter, a first data input connected to ground, and a second data input connected to said second detection means.

17. A pulse monitor circuit as claimed in claim 6, wherein said second storage means comprises: an inverter; a flip-flop having a clock input connected to said reference signal source via said inverter, and first and second data inputs connected to said second detection means.

* * * * *